United States Patent
Kang et al.

(10) Patent No.: US 7,164,594 B2
(45) Date of Patent: Jan. 16, 2007

(54) NONVOLATILE FERROELECTRIC MEMORY DEVICE

(75) Inventors: Hee Bok Kang, Daejeongwangyeok-si (KR); Jin Hong Ahn, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 9 days.

(21) Appl. No.: 11/091,372

(22) Filed: Mar. 29, 2005

(65) Prior Publication Data

US 2006/0139986 A1 Jun. 29, 2006

(30) Foreign Application Priority Data

Dec. 24, 2004 (KR) .................. 10-2004-0112170

(51) Int. Cl.
*G11C 11/22* (2006.01)
(52) U.S. Cl. ......................... 365/145; 365/65
(58) Field of Classification Search ............... 365/65
See application file for complete search history.

(56) References Cited

U.S. PATENT DOCUMENTS

| | | | |
|---|---|---|---|
| 5,737,261 A * | 4/1998 | Taira | 365/145 |
| 5,903,492 A * | 5/1999 | Takashima | 365/145 |
| 6,366,490 B1 * | 4/2002 | Takeuchi et al. | 365/145 |
| 6,456,520 B1 * | 9/2002 | Kato et al. | 365/145 |
| 6,522,569 B1 * | 2/2003 | Miyakawa et al. | 365/145 |
| 6,584,009 B1 * | 6/2003 | Roehr et al. | 365/145 |
| 6,614,678 B1 * | 9/2003 | Kato et al. | 365/145 |
| 6,639,824 B1 * | 10/2003 | Wohlfahrt et al. | 365/145 |
| 6,724,761 B1 | 4/2004 | Moy-Yee et al. | |
| 6,950,361 B1 * | 9/2005 | Kamoshida et al. | 365/203 |

FOREIGN PATENT DOCUMENTS

| | | |
|---|---|---|
| JP | 11-273368 | 10/1999 |
| JP | 2001-156810 | 6/2001 |

* cited by examiner

*Primary Examiner*—Tan T. Nguyen
(74) *Attorney, Agent, or Firm*—Heller Ehrman LLP

(57) ABSTRACT

A nonvolatile ferroelectric memory device features a multi-bit serial cell structure where read bit lines and write bit lines are divided to control read/write paths individually, thereby improving a transmission operation of serial data. In the nonvolatile ferroelectric memory device, a serial cell that comprises a plurality of switching devices and a plurality of ferroelectric capacitors is connected serially between a write switching device and a read switching device. The serial cell stores cell data applied from the write bit line sequentially in the plurality of ferroelectric capacitors at a write mode, and outputs the cell data stored in a plurality of ferroelectric capacitors to the read bit line at a read mode.

20 Claims, 11 Drawing Sheets

NONVOLATILE FERROELECTRIC MEMORY DEVICE

BACKGROUND OF THE INVENTION

1. Field of the Invention

The present invention generally relates to a nonvolatile ferroelectric memory device, and more specifically, to a technology of improving speed of read/write operations depending on a process of serial data of a nonvolatile ferroelectric memory device having a multi-bit serial cell structure.

2. Description of the Related Art

In general, circuits having various functions are positioned together in a chip having a small area as a system structure has been complicated and developed to have high performance. However, the number of buses for transmitting data increases, which results in degradation of high integration. As a result, a method for transmitting serial data using a serial bus is applied.

FIG. 1 is a diagram illustrating a conventional nonvolatile ferroelectric memory device.

The conventional nonvolatile ferroelectric memory device comprises a 4-bit serial cell 1 and a switching transistor T5. Here, the serial cell 1, which is connected serially between a bit line BL and the switching transistor T5, comprises a plurality of NMOS transistors T1~T4 whose switching operations are controlled by each of word lines WL1~WL4.

The plurality of ferroelectric capacitors FC1~FC4 are connected in parallel between the word lines WL1~WL4 and nodes N1~N4, respectively. Also, the switching transistor T5, which is connected between the serial cell 1 and the bit line BL, has a gate to receive a write enable control signal WEC.

The serial cell 1 comprises a plurality of unit cells C which share one bit line BL. As a result, the write enable control signal WEC is activated in a write or restore operation, so that write data are written sequentially in four unit cells C.

Referring to FIGS. 2 and 3, the operation of the above-described conventional nonvolatile ferroelectric memory device is explained.

At a read mode, the four unit cells are sequentially accessed to store sensed data sequentially in a register 2. On the other hand, at a write (restore) mode, the data stored in the register 2 are sequentially restored in each unit cell C.

More specifically, in a period t1, when the word line WL1 is activated at the read mode, the NMOS transistor T1 is turned on. Then, a sense amplifier senses cell data applied through the bit line BL, and stores first cell data D1 in the register 2.

Thereafter, in a period t2, when the word line WL2 is activated, the NMOS transistor T2 is turned on. Then, the sense amplifier senses the cell data applied through the bit line BL, and stores second cell data D2 in the register 2. Here, the word line WL1 is continuously kept at an active state, so that the cell data stored in the ferroelectric capacitor FC2 are transmitted to the bit line BL.

Thereafter, in a period t3, when the word line WL3 is activated, the NMOS transistor T3 is turned on. Then, the sense amplifier senses cell data applied through the bit line BL, and stores third cell data D3 in the register 2. Here, the word lines WL1 and WL2 are continuously kept at an active state, so that the cell data stored in the ferroelectric capacitor FC3 are transmitted to the bit line BL.

Next, in a period t4, when the word line WL4 is activated, the NMOS transistor T4 is turned on. Then, the sense amplifier senses the cell data applied through the bit line BL, and stores fourth cell data D4 in the register 2. Here, the word lines WL1~WL3 are continuously kept at an active state, so that the cell data stored in the ferroelectric capacitor FC4 are transmitted to the bit line BL.

Here, a restore operation is not performed at the read mode in the periods t1~t4. After the final cell data D4 is read in the period t4, the first cell data D1 is restored in the cell C from a period t5.

That is, at a write (restore) mode, when the write enable control signal WEC is activated, the switching transistor T5 is turned on.

Then, in the period t5, the first cell data D1 stored in the register 2 is stored in the ferroelectric capacitor FC1 through the bit line BL. Thereafter, when the word line WL1 transits from 'high' to 'low', high data are written in the ferroelectric capacitor FC1. Here, the word lines WL2~WL4 are continuously kept at the active state, so that the cell data D1 is transmitted to a node ND1.

Thereafter, in a period t6, the second cell data D2 stored in the register 2 is stored in the ferroelectric capacitor FC2 through the bit line BL. Then, the word line WL2 transits from 'high' to 'low', high data are written in the ferroelectric capacitor FC2. Here, the word lines WL3~WL4 are continuously kept at the active state, so that the cell data D2 is transmitted to a node ND2.

Next, in a period t7, the third cell data D3 stored in the register 2 is stored in the ferroelectric capacitor FC3 through the bit line BL. Then, the word line WL3 transmits from 'high' to 'low', high data are written in the ferroelectric capacitor FC3. Here, the word line WL4 is continuously kept at the active state, so that the cell data D3 is transmitted to a node ND3.

Then, in a period t8, the fourth cell data D4 stored in the register 2 is stored in the ferroelectric capacitor FC4 through the bit line BL. Thereafter, the word line WL4 transits from 'high' to 'low', high data are written in the ferroelectric capacitor FC4.

However, in the conventional nonvolatile ferroelectric memory device, the read operation is required after the write operation of the four cell data D1~D4 is performed. In other words, other cells cannot be accessed while the write operation is performed on the four cell data D1~D4.

As a result, since the conventional nonvolatile ferroelectric memory device requires an additional restore time after the sensing operation of the cell data, the data transmission speed is degraded in transmission of the successive serial data.

SUMMARY OF THE INVENTION

Accordingly, it is an object of the present invention to improve a successive transmission operation of serial data by dividing read bit lines and write bit lines in a multi-bit serial cell structure to individually control read/write paths.

In an embodiment, a nonvolatile ferroelectric memory device comprises a serial cell, a write switching element and a read switching element. The serial cell comprises a plurality of ferroelectric capacitors connected in parallel to a plurality of serially connected switching elements whose switching operations are selectively controlled depending on states of a plurality of word lines. The write switching element outputs cell data applied from a write bit line to the serial cell when a write enable control signal is activated.

The read switching element outputs the cell data stored in the serial cell to a read bit line when a read enable control signal is activated.

In another embodiment, a nonvolatile ferroelectric memory device comprises a plurality of multi-bit serial cells, a plurality of read switching elements, a plurality of write switching elements, a plurality of sense amplifiers, a read control unit, a plurality of registers and a write control unit. The plurality of multi-bit serial cells are connected in serial between a pair of a plurality of read bit lines and a plurality of write bit lines which are arranged in row and column directions. The plurality of read switching elements selectively control connection of the plurality of read bit lines and the plurality of multi-bit serial cells. The plurality of write switching elements selectively control connection of the plurality of write bit lines and the plurality of multi-bit serial cells. The plurality of sense amplifiers are connected one by one to the plurality of read bit lines. The read control unit, connected one by one to the plurality of sense amplifiers, controls sensing operations of the plurality of sense amplifiers at a read mode. The plurality of registers store cell data sensed from the plurality of sense amplifiers. The write control unit, connected one by one to the plurality of write bit lines, outputs the cell data stored in the plurality of registers to the plurality of write bit lines at a write mode. Here, each of the plurality of multi-bit serial cells comprises: a plurality of switching elements whose switching operations are selectively controlled depending on states of a plurality of word lines; and a plurality of ferroelectric capacitors, connected in parallel to the plurality of switching elements, for storing the cell data.

In still another embodiment, a nonvolatile ferroelectric memory device comprises a plurality of sub bit lines, a plurality of serial cells, a global sense amplifier, a plurality of sub sense amplifiers, a register, a plurality of write switching elements and a plurality of read switching elements. The plurality of sub bit lines are connected to a read bit line. The plurality of serial cells are connected serially between the plurality of sub bit lines and a write bit line. The global sense amplifier, connected to one by one to the read bit line, senses and amplifies cell data applied to the read bit line. The plurality of sub sense amplifiers, connected one by one to the plurality of sub bit lines, sense cell data applied to the plurality of sub bit lines to output the cell data to the global sense amplifier. The register, connected between the global sense amplifier and the write bit line, stores the cell data applied from the global sense amplifier. The plurality of write switching elements outputs the cell data applied from the write bit line to the serial cell when a write enable control signal is activated. The plurality of read switching elements outputs the cell data stored in the plurality of serial cells to the plurality of sub bit lines when a read enable control signal is activated. Here, each of the plurality of serial cells comprises: a plurality of switching elements whose switching operations are selectively controlled depending on states of a plurality of word lines; and a plurality of ferroelectric capacitors, connected in parallel to the plurality of switching elements, for storing the cell data.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
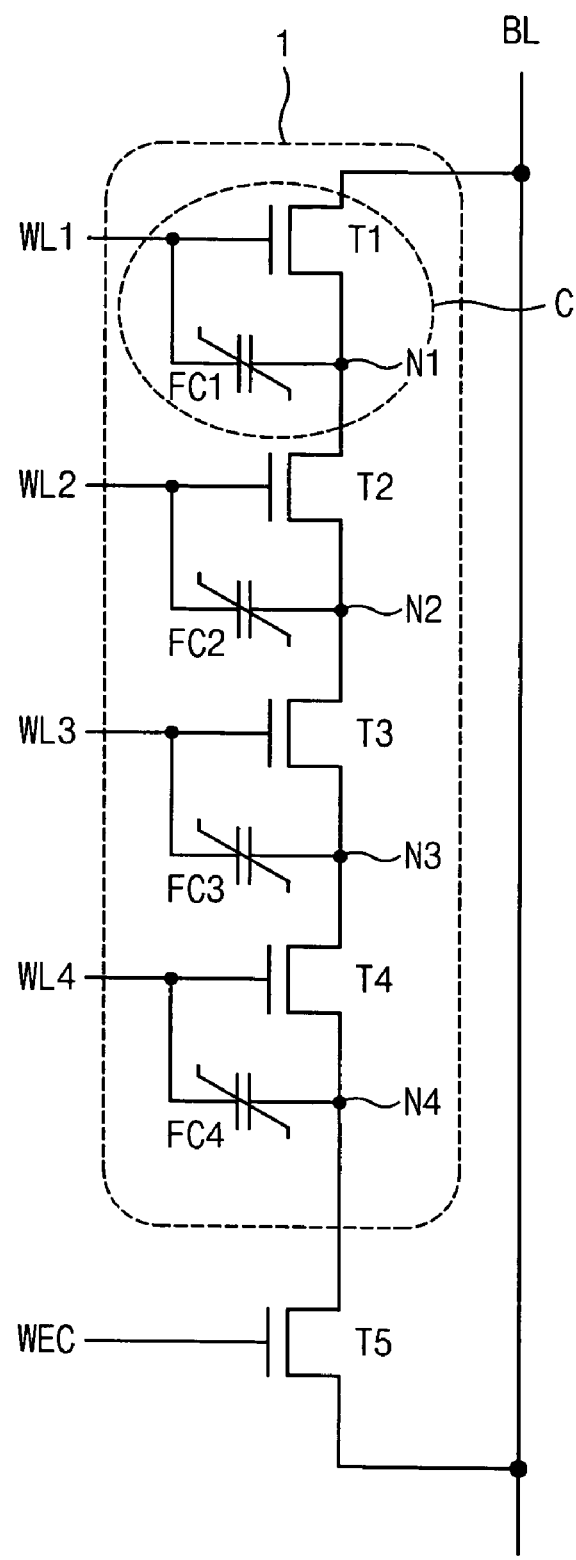
FIG. 1 is a diagram illustrating a conventional nonvolatile ferroelectric memory device.
Figure 2:
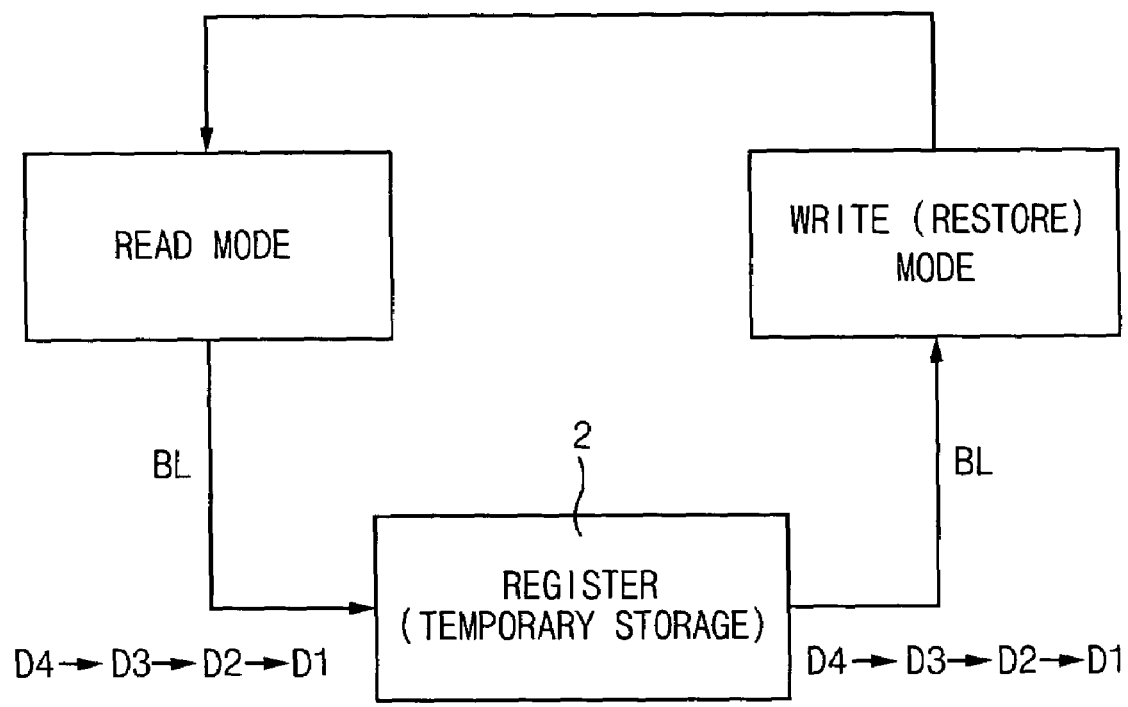
FIGS. 2 and 3 are diagrams illustrating the operation of the conventional nonvolatile ferroelectric memory device.
Figure 3:
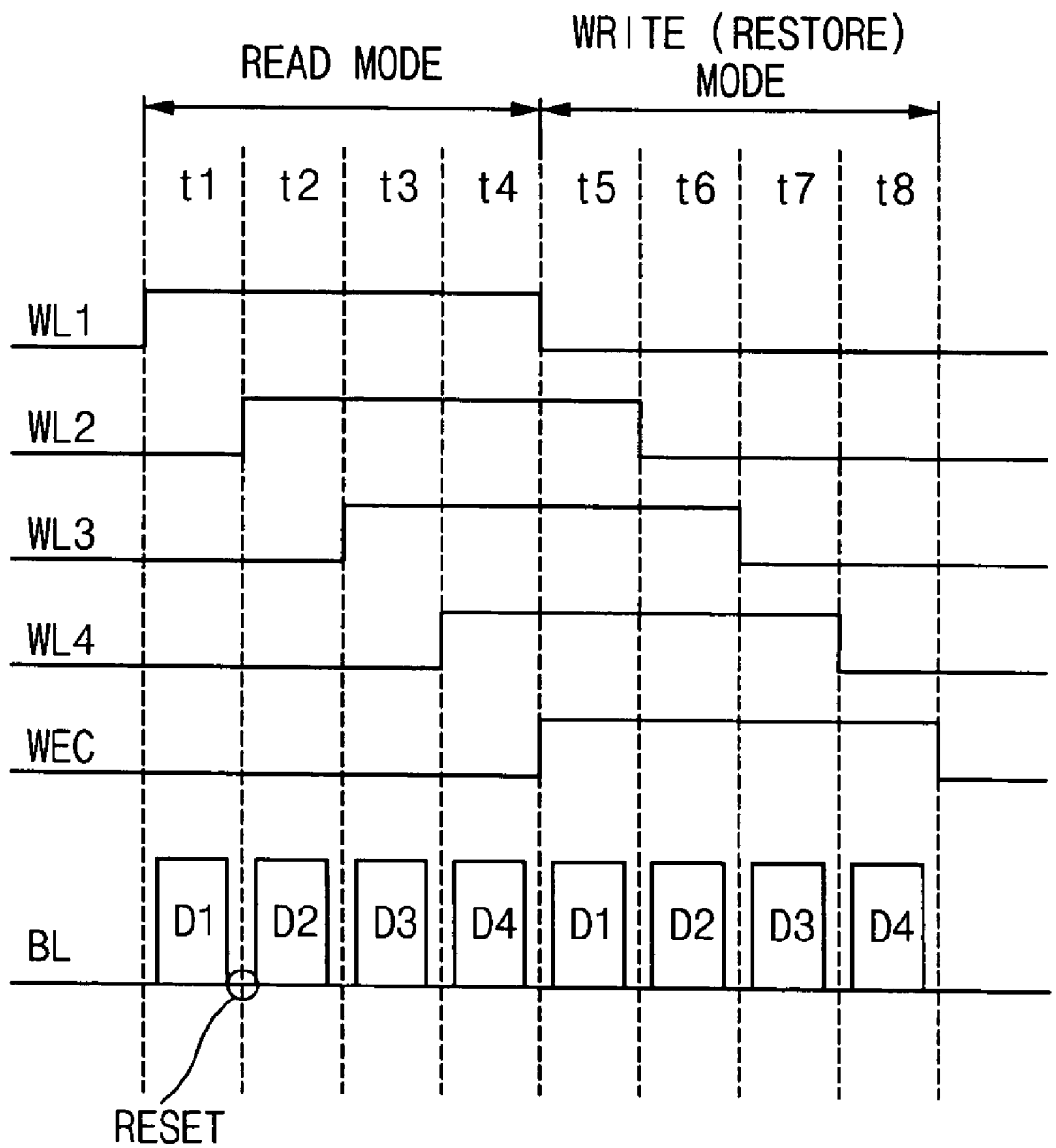
Figure 4:
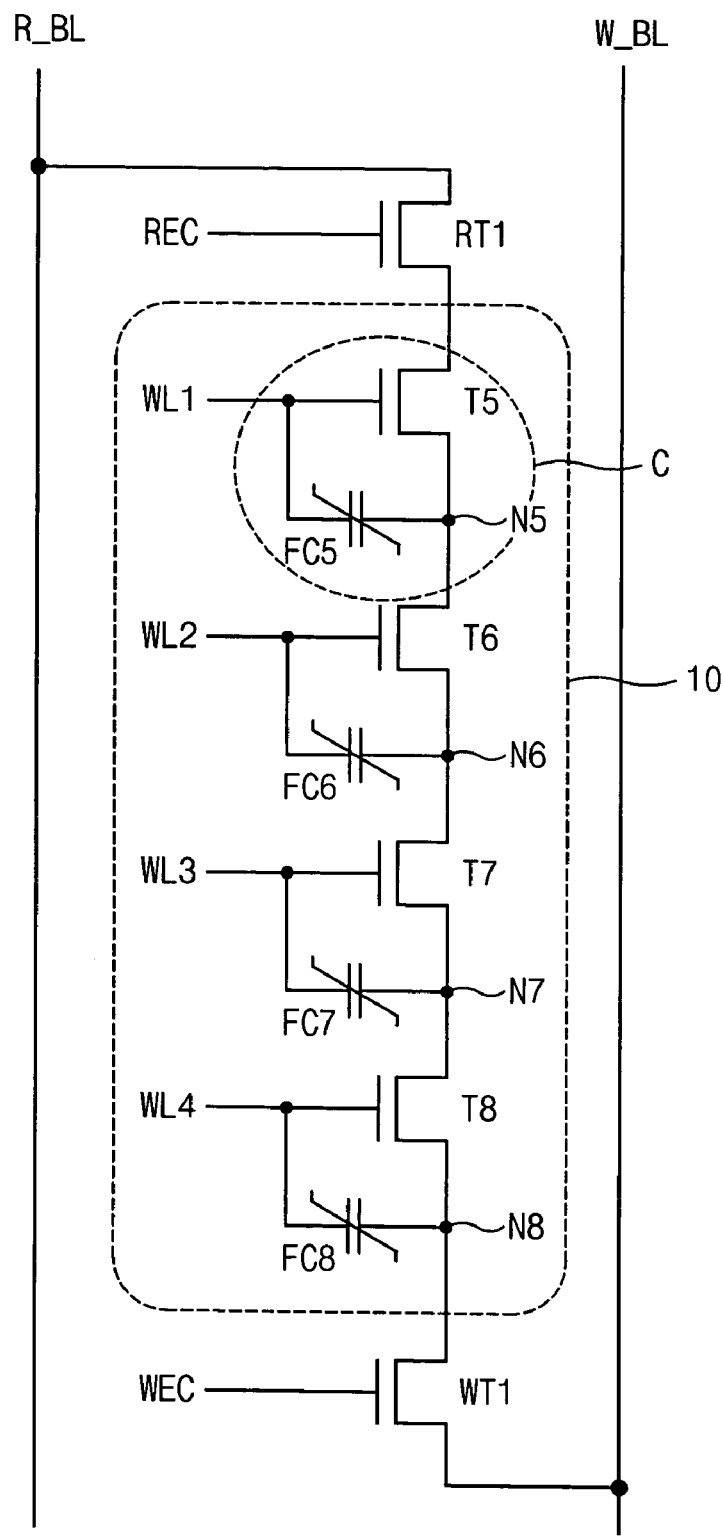
FIG. 4 is a diagram illustrating a nonvolatile ferroelectric memory device according to an embodiment of the present invention.

FIG. 4 is a diagram illustrating a nonvolatile ferroelectric memory device according to an embodiment of the present invention.

In an embodiment, the nonvolatile ferroelectric memory device comprises a 4-bit serial cell 10, a read switching element RT1 and a write switching element WT1. Here, the read switching element RT1, which is connected between a read bit line R_BL and the serial cell 10, has a gate to receive a read enable control signal REC. The write switching element WT1, which is connected between a write bit line W-BL and the serial cell 10, has a gate to a write enable control signal WEC.

The serial cell 10 comprises NMOS transistors T5~T8 which are connected serially between the read switching element RT1 and the write switching element WT1 and whose switching operations are controlled by word lines WL1~WL4, respectively. Also, the serial cell 10 comprises a plurality of ferroelectric capacitors FC5~FC8 connected in parallel between the word lines WL1~WL4 and nodes N5~N8.

The serial cell 10 is connected through the read switching element RT1 to the read bit line R_BL and through the write switching element WT1 to the write bit line W_BL.

Figure 5:
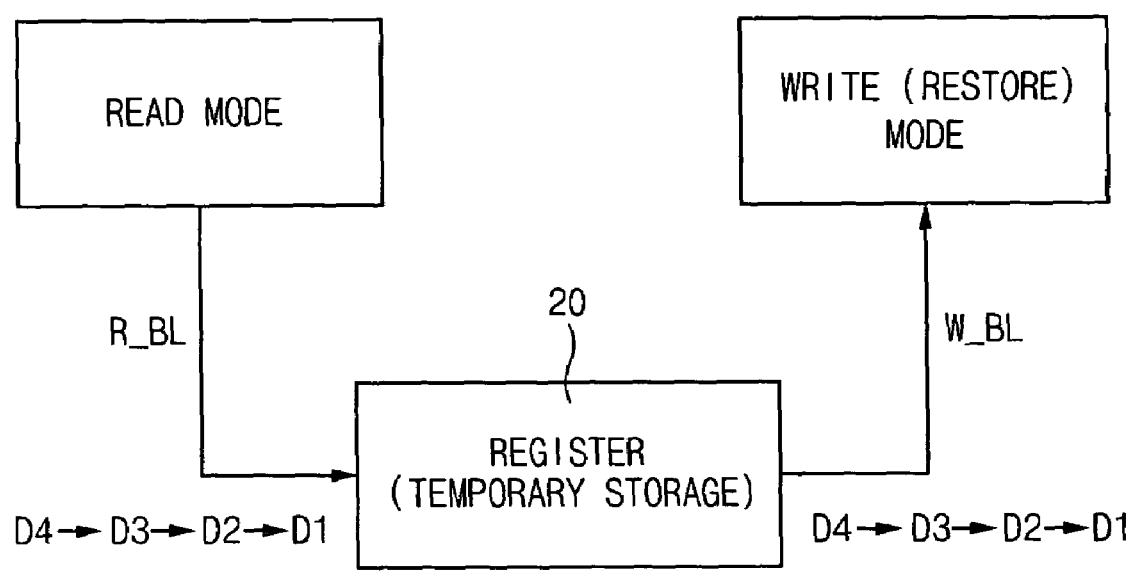
FIGS. 5 and 6 are diagrams illustrating the operation of the nonvolatile ferroelectric memory device according to an embodiment of the present invention.
Figure 6:
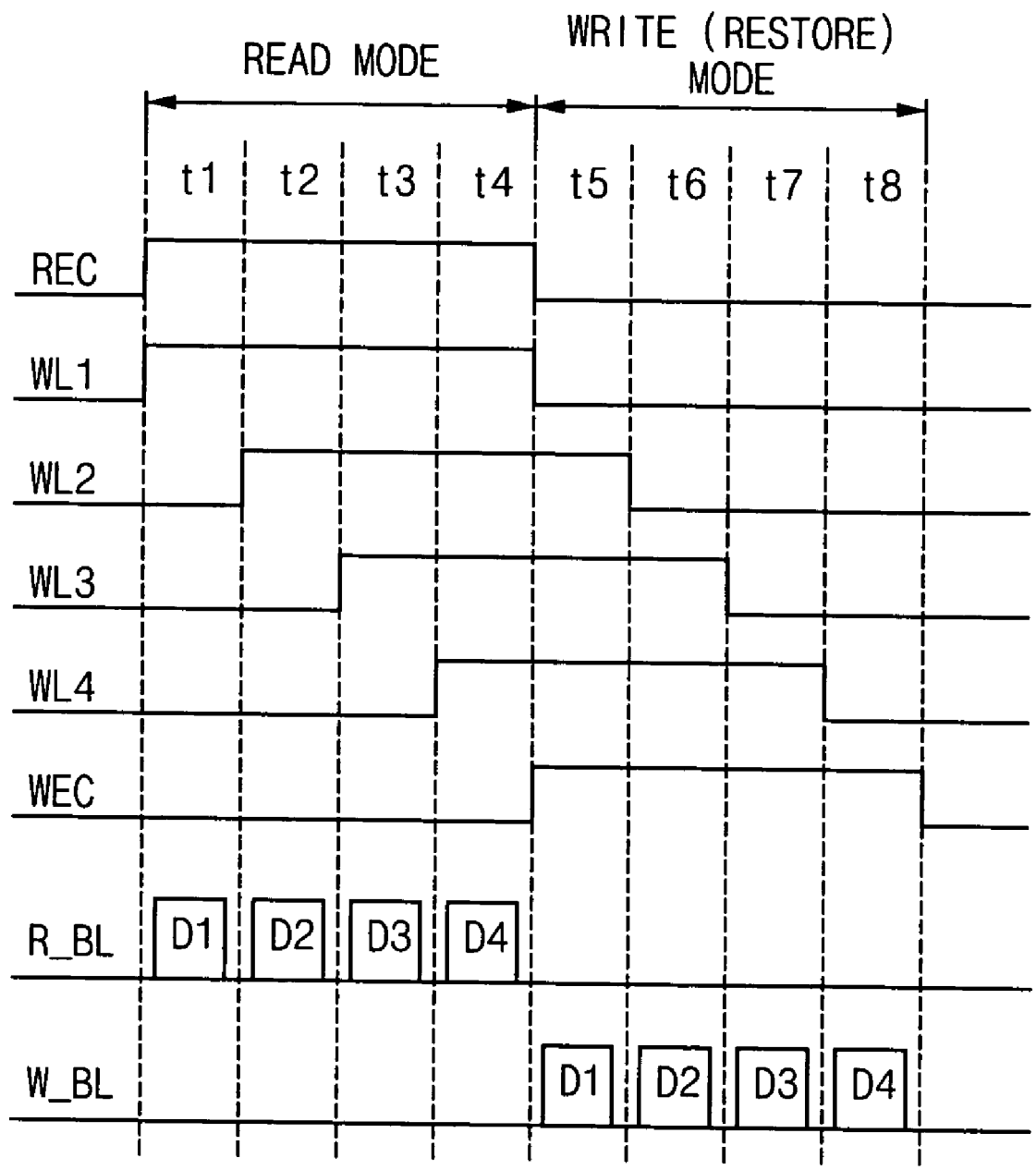

Referring to FIGS. 5 and 6, the operation of the nonvolatile ferroelectric memory device according to an embodiment of the present invention is explained.

At a read mode, when the read enable control signal REC is activated, four cell data are sequentially outputted to the read bit line R_BL and stored in a register 20. On the other hand, at a write (restore) mode, a write enable control signal WEC is activated, the four cell data applied from the register 20 through the write bit line W_BL are sequentially stored in the serial cell 10.

At the read mode, the read enable control signal REC is kept at an active state in periods t1~t4, so that the read switching element RT1 is turned on.

In the period t1, when the word line WL1 is activated, the NMOS transistor T5 is turned on. Then, a sense amplifier senses the cell data applied through the read bit line R_BL, and stores first cell data D1 in the register 20.

Thereafter, in the period t2, when the word line WL2 is activated, the NMOS transistor T6 is turned on. Then, sense amplifier senses the cell data applied through the read bit line R_BL, and stores second cell data D2 in the register 20. Here, the word line WL1 is continuously kept at the active state, so that the cell data stored in the ferroelectric capacitor FC6 are transmitted to the read bit line R_BL.

Thereafter, in the period t3, when the word line WL3 is activated, the NMOS transistor T7 is turned on. Then, the sense amplifier senses cell data applied through the read bit line R_BL, and stores third cell data D3 in the register 20. Here, the word lines WL1 and WL2 are continuously kept at the active state, so that the cell data stored in the ferroelectric capacitor FC7 are transmitted to the read bit line R_BL.

Next, in the period t4, when the word line WL4 is activated, the NMOS transistor T8 is turned on. Then, the sense amplifier senses the cell data applied through the read bit line R_BL, and stores fourth cell data D4 in the register 20. Here, the word lines WL1~WL3 are continuously kept at the active state, so that the cell data stored in the ferroelectric capacitor FC8 are transmitted to the read bit line R_BL.

Here, a restore operation is not performed at the read mode in the periods t1~t4. After the final data D4 is read in the period t4, the first cell data D1 is restored in the cell C from a period t5.

That is, at a write (restore) mode, when the write enable control signal WEC is kept at the active state in periods t5~t8, the write switching transistor WT1 is turned on.

Then, in the period t5, the first cell data D1 stored in the register 20 is stored in the ferroelectric capacitor FC5 through the write bit line W_BL. Thereafter, when the word line WL1 transits from 'high' to 'low', high data are written in the ferroelectric capacitor FC5. Here, the word lines WL2~WL4 are continuously kept at the active state, so that the cell data D1 is transmitted to a node ND5.

Thereafter, in the period t6, the second cell data D2 stored in the register 20 is stored in the ferroelectric capacitor FC6 through the write bit line W_BL. Then, the word line WL2 transits from 'high' to 'low', high data are written in the ferroelectric capacitor FC6. Here, the word lines WL3~WL4 are continuously kept at the active state, so that the cell data D2 is transmitted to a node ND6.

Next, in the period t7, the third cell data D3 stored in the register 20 is stored in the ferroelectric capacitor FC7 through the write bit line W_BL. Then, the word line WL3 transmits from 'high' to 'low', high data are written in the ferroelectric capacitor FC7. Here, the word line WL4 is continuously kept at the active state, so that the cell data D3 is transmitted to a node ND8.

Then, in the period t8, the fourth cell data D4 stored in the register 20 is stored in the ferroelectric capacitor FC8 through the write bit line W_BL. Thereafter, the word line WL4 transits from 'high' to 'low', high data are written in the ferroelectric capacitor FC8.

Figure 7:
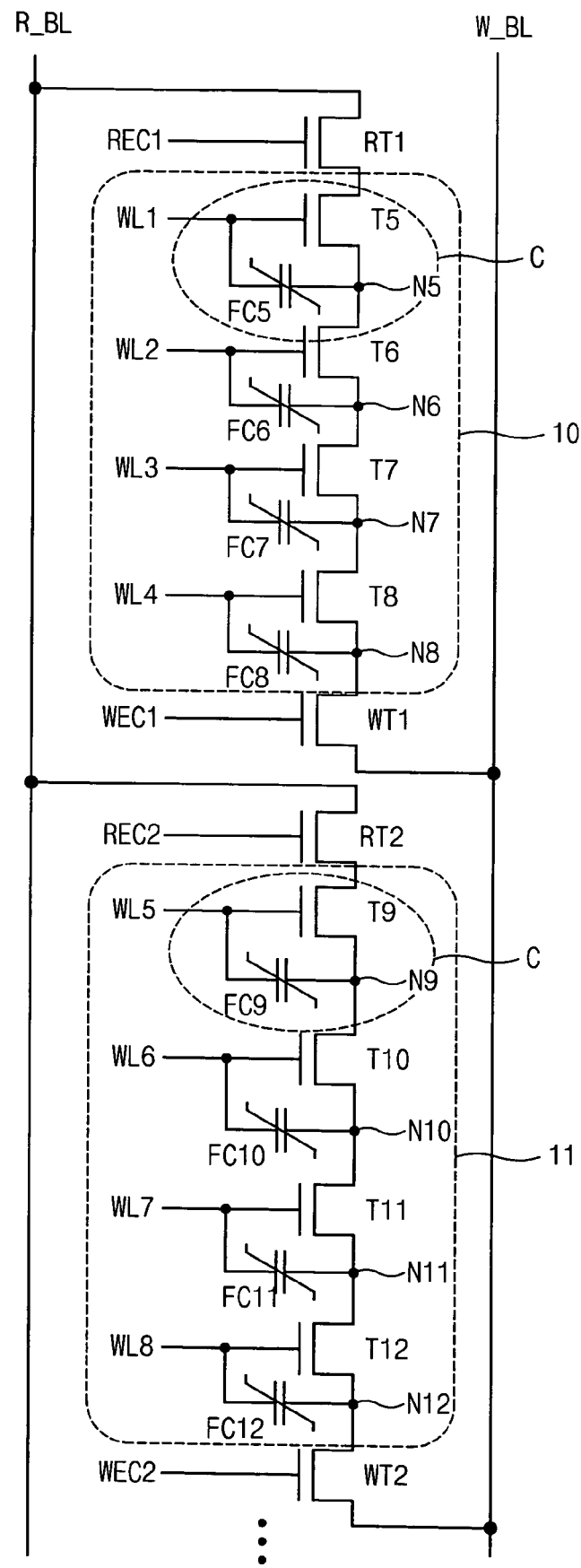
FIG. 7 is a diagram illustrating another example of the nonvolatile ferroelectric memory device according to an embodiment of the present invention.

FIG. 7 is a diagram illustrating another example of the nonvolatile ferroelectric memory device according to an embodiment of the present invention.

In an embodiment, the nonvolatile ferroelectric memory device of FIG. 7 has a structure where serials cells 10 and 11 that have the same configuration as that of FIG. 4 are repeated in column direction. A plurality of serial cells 10 and 11 arranged in the column direction are connected in common to a read bit line R_BL and a write bit line W_BL.

Here, the 4-bit serial cell 10 comprises NMOS transistors T5~T8 and ferroelectric capacitors FC5~FC8. The 4-bit serial cell 11 comprises NMOS transistors T9~T12 and ferroelectric capacitors FC9~FC12.

The 4-bit serial cell 10 is connected through a read switching element RT1 to the read bit line R_BL and through a writing switching element WT1 to the write bit line W_BL. The 4-bit serial cell 11 is connected through a read switching element RT2 to the read bit line R_BL and through a write switching element WT2 to the write bit line W_BL.

Figure 8:
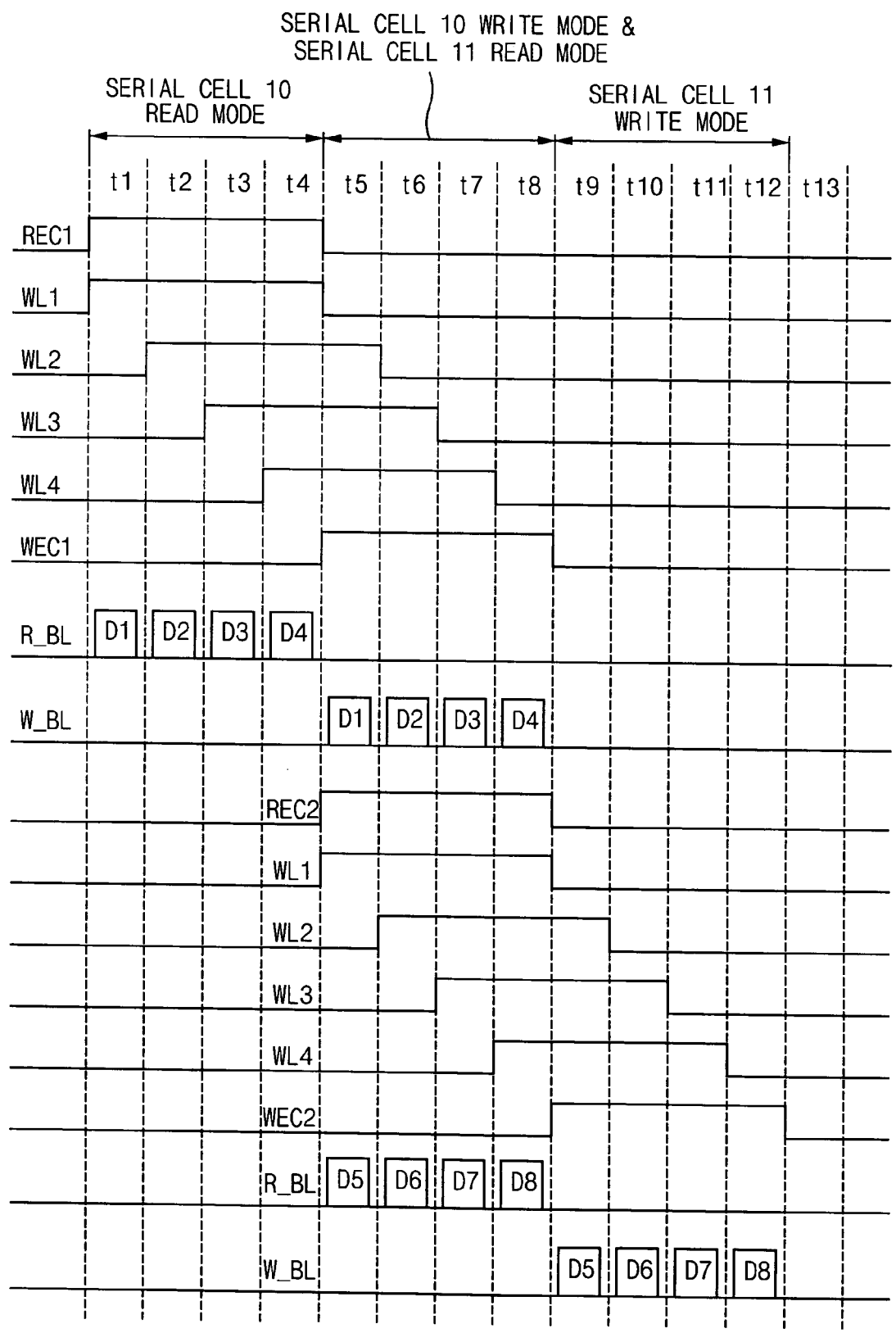
FIG. 8 is a timing diagram illustrating the nonvolatile ferroelectric memory device of FIG. 7.

FIG. 8 is a timing diagram illustrating the nonvolatile ferroelectric memory device of FIG. 7.

At a read mode, when a read enable control signal REC is activated, four cell data are sequentially outputted to the read bit line R_BL. On the other hand, at a write (restore) mode, a write enable control signal WEC is activated, the four cell data applied from the register 20 through the write bit line W_BL are sequentially stored in the serial cells 10 and 11.

At the read mode, a read enable control signal REC1 is kept at an active state in periods t1~t4, so that the read switching element RT1 is turned on.

In the period t1, when a word line WL1 is activated, the NMOS transistor T5 is turned on. Then, a sense amplifier senses the cell data applied through the read bit line R_BL, and stores first cell data D1 in a register 20.

Thereafter, in the period t2, when a word line WL2 is activated, the NMOS transistor T6 is turned on. Then, the sense amplifier senses the cell data applied through the read bit line R_BL, and stores second cell data D2 in the register 20. Here, the word line WL1 is continuously kept at the active state, so that the cell data stored in the ferroelectric capacitor FC6 are transmitted to the read bit line R_BL.

Thereafter, in the period t3, when a word line WL3 is activated, the NMOS transistor T7 is turned on. Then, the sense amplifier senses cell data applied through the read bit line R_BL, and stores third cell data D3 in the register 20. Here, the word lines WL1 and WL2 are continuously kept at the active state, so that the cell data stored in the ferroelectric capacitor FC7 are transmitted to the read bit line R_BL.

Next, in the period t4, when a word line WL4 is activated, the NMOS transistor T8 is turned on. Then, the sense amplifier senses the cell data applied through the read bit line R_BL, and stores fourth cell data D4 in the register 20. Here, the word lines WL1~WL3 are continuously kept at the active state, so that the cell data stored in the ferroelectric capacitor FC8 are transmitted to the read bit line R_BL.

Here, a restore operation is not performed at the read mode in the periods t1~t4. After the final cell data D4 is read in the period t4, the first cell data D1 is restored in the serial cell C from a period t5.

That is, at a write (restore) mode, when a write enable control signal WEC1 is kept at the active state in periods t5~t8, the write switching transistor WT1 is turned on. At the same time, at the read mode of the serial cell 11, a read enable control signal REC2 is kept at an active state in the periods t5~t8, so that the read switching element RT1 is turned on.

As a result, the write (restore) operation of the serial cell 10 and the read operation of the serial cell 11 can be simultaneously performed in the periods t5~t8.

At the write mode of the serial cell 10, in the period t5, the first cell data D1 stored in the register 20 is stored in the ferroelectric capacitor FC5 through the write bit line W_BL. Thereafter, when the word line WL1 transits from 'high' to 'low', high data are written in the ferroelectric capacitor FC5. Here, the word lines WL2~WL4 are continuously kept at the active state, so that the cell data D1 is transmitted to a node ND5.

Thereafter, in the period t6, the second cell data D2 stored in the register 20 is stored in the ferroelectric capacitor FC6 through the write bit line W_BL. Then, the word line WL2 transits from 'high' to 'low', high data are written in the ferroelectric capacitor FC6. Here, the word lines WL3~WL4 are continuously kept at the active state, so that the cell data D2 is transmitted to a node ND6.

Next, in the period t7, the third cell data D3 stored in the register 20 is stored in the ferroelectric capacitor FC7 through the write bit line W_BL. Then, the word line WL3 transmits from 'high' to 'low', high data are written in the ferroelectric capacitor FC7. Here, the word line WL4 is continuously kept at the active state, so that the cell data D3 is transmitted to a node ND8.

Then, in the period t8, the fourth cell data D4 stored in the register 20 is stored in the ferroelectric capacitor FC8 through the write bit line W_BL. Thereafter, the word line WL4 transits from 'high' to 'low', high data are written in the ferroelectric capacitor FC8.

Meanwhile, at the read mode of the serial cell 11, the read enable control signal REC2 is continuously kept at an active state in the periods t5~t8, so that the read switching element RT2 is turned on.

In the period t5, when a word line WL5 is activated, the NMOS transistor T9 is turned on. Then, the sense amplifier senses the cell data applied through the read bit line R_BL, and stores first cell data D5 in the register 20.

Thereafter, in the period t6, when a word line WL6 is activated, the NMOS transistor T10 is turned on. Then, the sense amplifier senses the cell data applied through the read bit line R_BL, and stores second cell data D6 in the register 20. Here, the word line WL5 is continuously kept at an active state, so that the cell data stored in the ferroelectric capacitor FC10 are transmitted to the read bit line R_BL.

Thereafter, in the period t7, when a word line WL7 is activated, the NMOS transistor T11 is turned on. Then, the sense amplifier senses cell data applied through the read bit line R_BL, and stores third cell data D7 in the register 20. Here, the word lines WL5 and WL6 are continuously kept at the active state, so that the cell data stored in the ferroelectric capacitor FC11 are transmitted to the read bit line R_BL.

Next, in the period t8, when a word line WL8 is activated, the NMOS transistor T12 is turned on. Then, the sense amplifier senses the cell data applied through the read bit line R_BL, and stores fourth cell data D8 in the register 20. Here, the word lines WL5~WL7 are continuously kept at the active state, so that the cell data stored in the ferroelectric capacitor FC12 are transmitted to the read bit line R_BL.

Here, after the final cell data D8 of the serial cell 11 is read in the period t8, the first cell data D5 of the serial cell 11 is restored in the cell C from a period t9.

At the write mode of the serial cell 11, the first cell data D5 stored in the register 20 is stored in the ferroelectric capacitor FC9 through the write bit line W_BL in the period t9. Thereafter, when the word line WL5 transits from 'high' to 'low', low data are written for a half cycle and high data are written in the ferroelectric capacitor FC5 for the rest half cycle. Here, the word lines WL6~WL8 are continuously kept at the active state, so that the cell data D5 is transmitted to a node ND9.

Then, in a period t10, the second cell data D6 stored in the register 20 is stored in the ferroelectric capacitor FC10 through the write bit line W_BL. Next, when the word line WL6 transits from 'high' to 'low', low data are written for a half cycle, and high data are written in the ferroelectric capacitor FC10 for the rest half cycle. Here, the word lines WL7~WL8 are continuously kept at the active state, so that the cell data D6 is transmitted to a node ND10.

In a period t11, the third cell data D7 stored in the register 20 is stored in the ferroelectric capacitor FC11 through the write bit line W_BL. Then, when the word line WL7 transits from 'high' to 'low', low data are written for a half cycle, and high data are written in the ferroelectric capacitor FC11 for the rest half cycle. Here, the word line WL8 is continuously kept at the active state, so that the cell data D7 is transmitted to a node ND12.

Next, in a period t12, the fourth cell data D8 stored in the register 20 is stored in the ferroelectric capacitor FC12 through the write bit line W_BL. Then, when the word line W18 transits from 'high' to 'low', low data are written for a half cycle, and high data are written in the ferroelectric capacitor FC12 for the rest half cycle.

Figure 9:
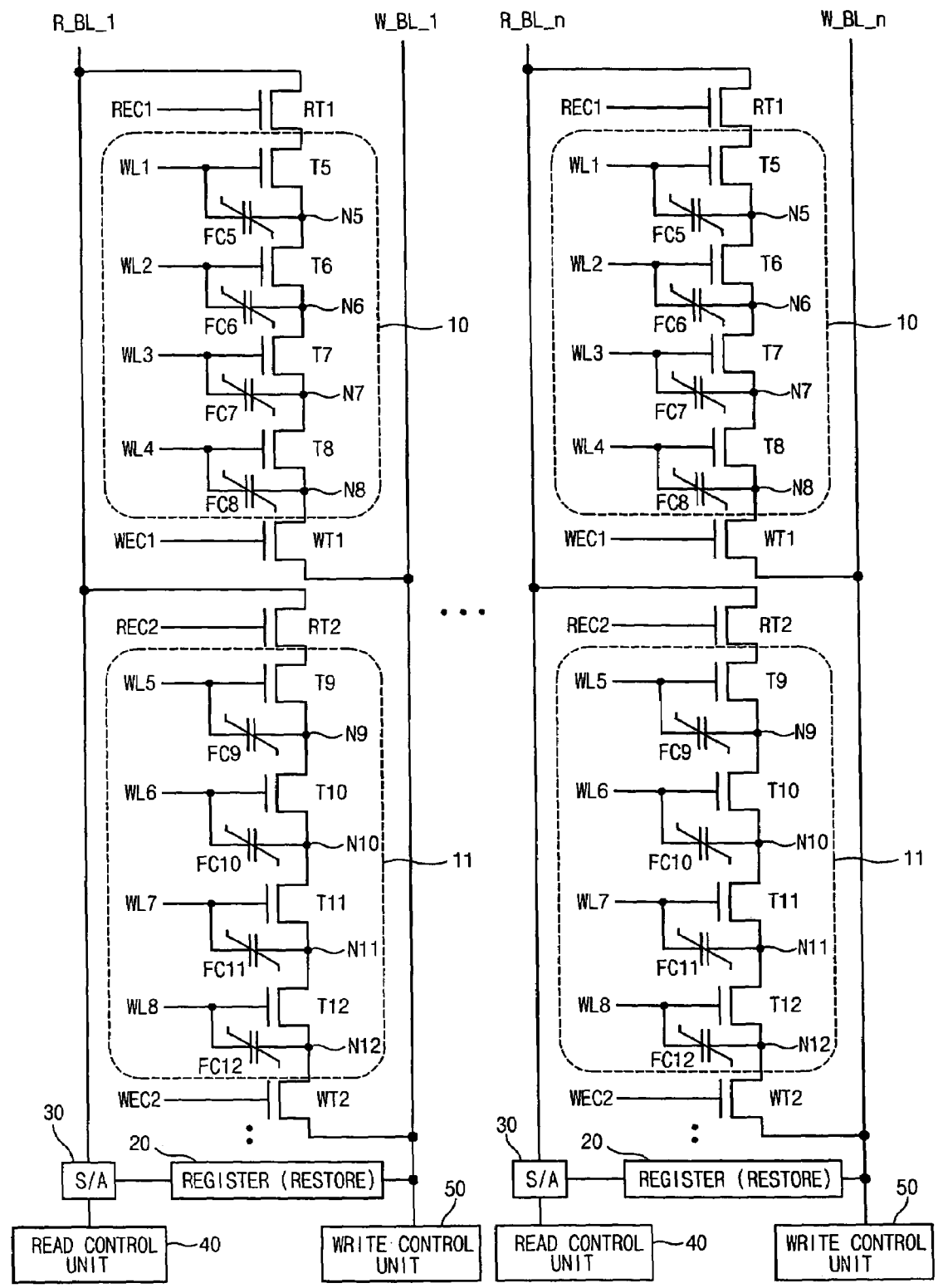
FIGS. 9 to 11 are diagrams illustrating other examples of the nonvolatile ferroelectric memory device according to an embodiment of the present invention.

FIG. 9 is a diagram illustrating still another example of the nonvolatile ferroelectric memory device according to an embodiment of the present invention.

In an embodiment, the nonvolatile ferroelectric memory device of FIG. 9 has a structure where a plurality of 4-bit serial cells 10 and 11 are repeated in row and column directions. The plurality of serial cells 10 and 11 arranged in the column direction are connected in common to a read bit line R_BL and a write bit line W_BL, respectively.

Here, the read bit line R_BL is connected to a sense amplifier 30, and the write bit line W_BL is connected to a register 20. A read control unit 40 connected to the sense amplifier 30 controls read operations of the serial cells 10 and 11. A write control unit 50 connected to the register 20 and the write bit line W_BL controls write operations of the serial cells 10 and 11.

In the embodiment of FIG. 9, at a read mode, when a read enable control signal REC is activated, four cell data applied from the serial cell 10 or 11 are sequentially outputted to the read bit line R_BL and applied to the sense amplifier 30. The sense amplifier 30 stores the cell data applied from the read bit line R_BL in the register 20 depending on the control of the read control unit 40.

On the other hand, at a write (restore) mode, when a write enable control signal WEC is activated, the cell data stored in the register 20 are outputted to the write bit line W_BL depending on the control of the write control unit 50. The four cell data applied from the write bit lien W_BL are sequentially stored in the serial cell 10 or 11.

Figure 10:
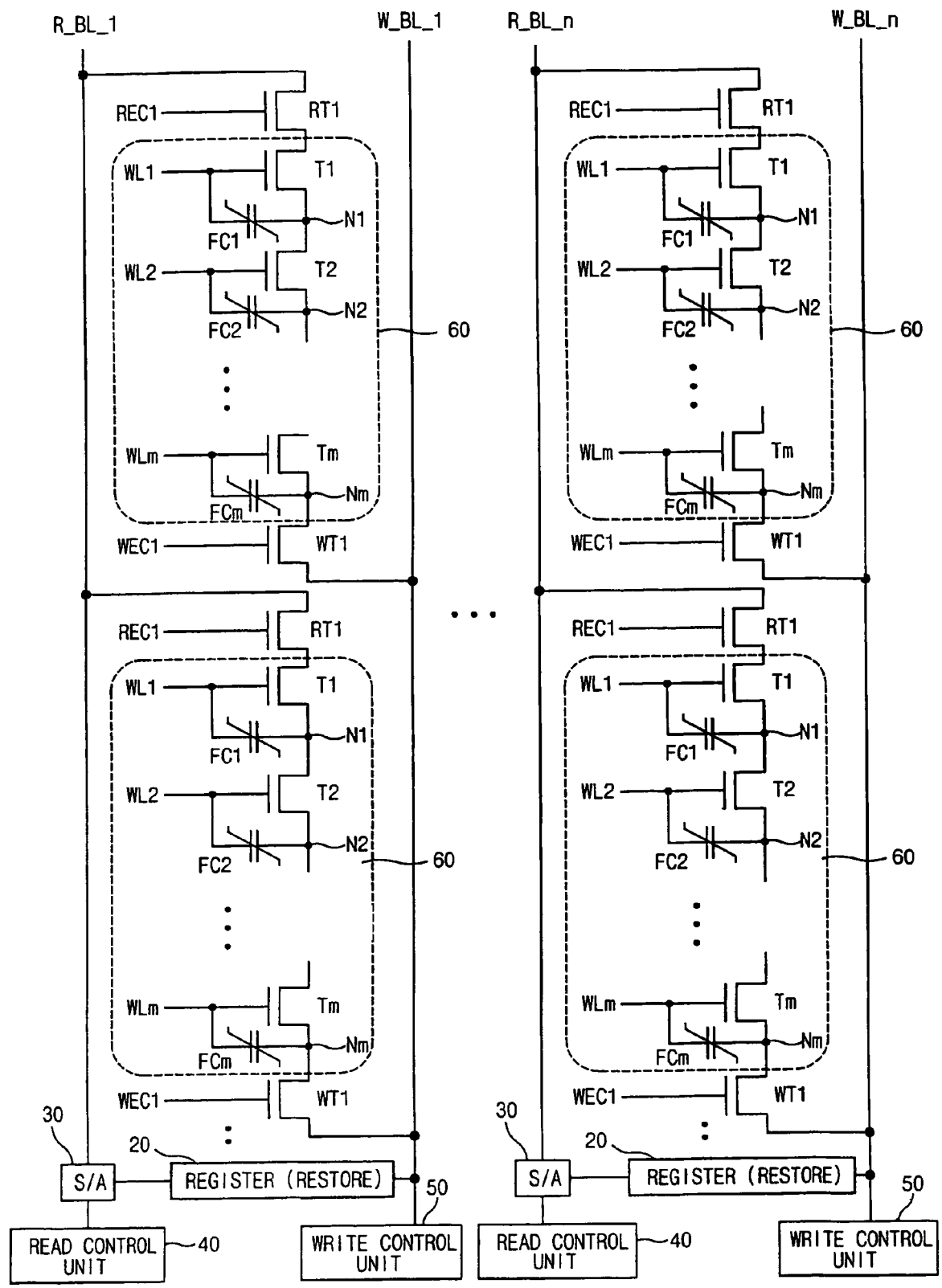

FIG. 10 is a diagram illustrating still another example of the nonvolatile ferroelectric memory device according to an embodiment of the present invention.

In the embodiment of FIG. 10, a multi-bit serial cell 60 comprises a plurality of NMOS transistors T1~Tm which are connected serially between a read switching element RT1 and a write switching element WT1 and whose switching operations are controlled by word lines WL1~WLm, respectively. The plurality of ferroelectric capacitors FC1~FCm are connected in parallel between the word lines WL~WLm and nodes N1~Nm.

Here, the multi-bit serial cell 60 is connected through the read switching element RT1 to a read bit line R_BL and through the write switching element WT1 to a write bit line W_BL.

Also, the nonvolatile ferroelectric memory device of FIG. 10 has a structure where a plurality of the multi-bit serial cells 60 are repeated in row and column directions. The plurality of the multi-bit serial cells 60 arranged in the column direction are connected in common to the read bit line R_BL and the write bit line W_BL.

Figure 11:
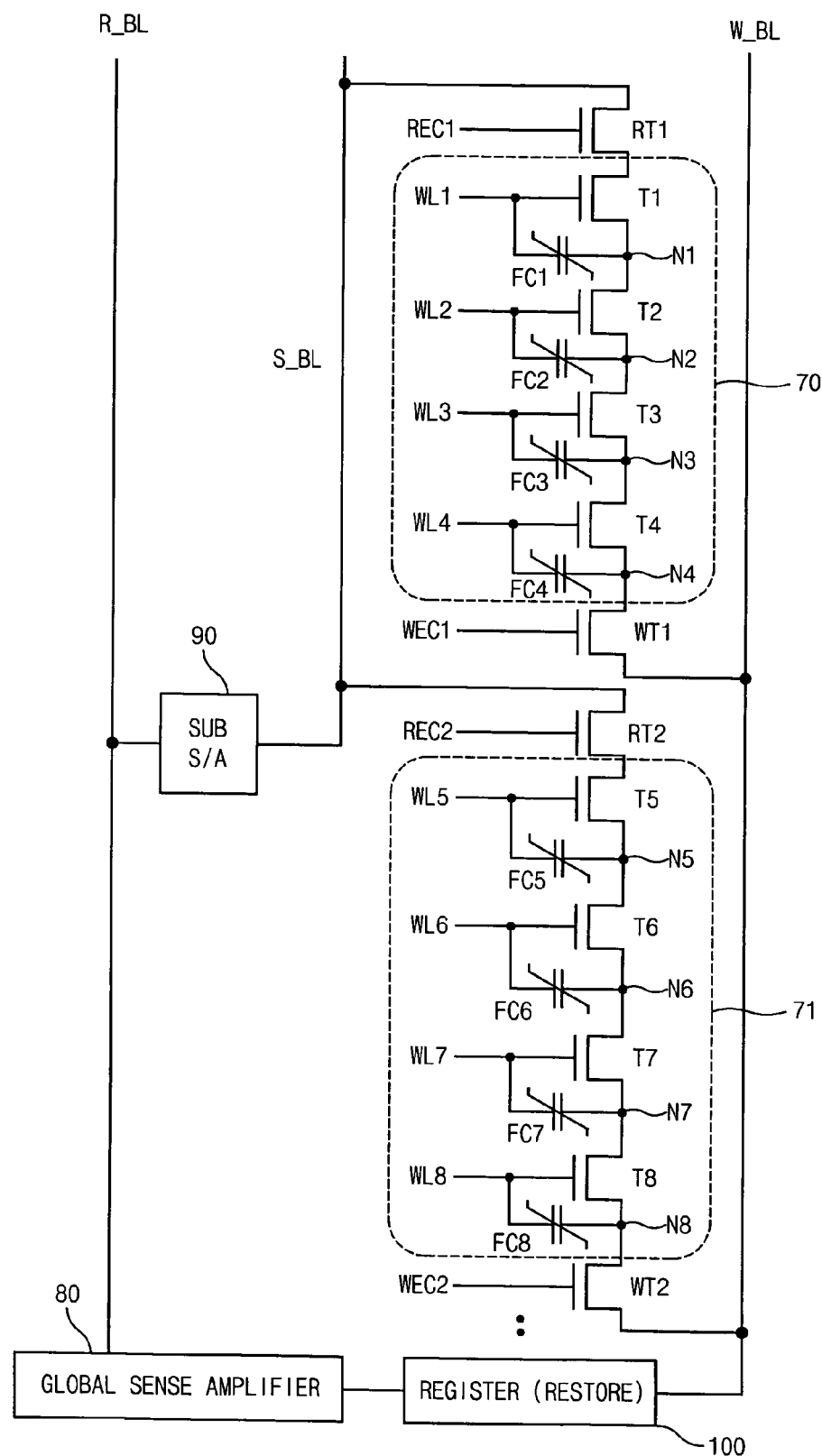

FIG. 11 is a diagram illustrating still another example of the nonvolatile ferroelectric memory device according to an embodiment of the present invention.

In the embodiment of FIG. 11, one read bit line R_BL is connected one by one to one global sense amplifier 80. The nonvolatile ferroelectric memory device of FIG. 11 has a hierarchical bit line structure including one read bit line R_BL connected through a plurality of sub sense amplifiers 90 to a plurality of sub bit lines S_BL. As a result, the sub sense amplifier 90 senses cell data applied from the sub bit line S_BL to output the cell data to the read bit line R_BL.

A plurality of 4-bit serial cells 70 and 71 are connected to one sub bit line S_BL. The plurality of 4-bit serial cells 70 and 71 are repeatedly arranged in row and column directions. The write bit line W_BL is connected to a register 100, and the cell data stored in the register 100 are written through the write bit line W_BL in the plurality of 4-bit serial cells 70 and 71.

As described above, in a nonvolatile ferroelectric memory device according to an embodiment of the present invention, read/write paths are individually controlled, so that an additional restore time is not required after a sensing operation of cell data, thereby improving a successive transmission operation of serial data.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A nonvolatile ferroelectric memory device comprising:
a write switching element for outputting cell data applied from a write bit line to a serial cell when a write enable control signal is activated; and
a read switching element for outputting the cell data stored in the serial cell to a read bit line when a read enable control signal is activated,
wherein the serial cell comprising a plurality of unit cells connected in series between the write switching element and the read switching element, wherein each of the plurality of unit cells comprises a switching element for performing a switching operation between two nodes depending on a state of a word line and a ferroelectric capacitor connected between the word line and one of the two nodes.

2. The nonvolatile ferroelectric memory device according to claim 1, wherein the serial cell, connected serially between the write switching element and the read switching element, sequentially stores the cell data applied from the write bit line in the plurality of ferroelectric capacitors at a write mode, and sequentially outputs the cell data stored in the plurality of ferroelectric capacitors to the read bit line at a read mode.

3. The nonvolatile ferroelectric memory device according to claim 1, wherein the serial cell sequentially outputs the cell data to the read bit line while the plurality of word lines are sequentially maintained at enable states when the read enable control signal is activated.

4. The nonvolatile ferroelectric memory device according to claim 3, wherein the serial cell sequentially stores the cell data applied from the write bit line while the plurality of word line are sequentially maintained at disable states when the write enable control signal is activated.

5. The nonvolatile ferroelectric memory device according to claim 1, wherein a plurality of the serial cells, a plurality of the write switching elements and a plurality of the read switching elements are arranged in row and column directions.

6. The nonvolatile ferroelectric memory device according to claim 5, wherein the plurality of the serial cells arranged in the column direction share one read bit line and one write bit line.

7. The nonvolatile ferroelectric memory device according to claim 6, wherein read/write paths of the plurality of the serial cells that share one read bit line and one write bit line are individually controlled so that read/write operations of other serial cells are simultaneously performed.

8. A nonvolatile ferroelectric memory device comprising:
a plurality of multi-bit serial cells connected in serial between a pair of a plurality of read bit lines and a plurality of write bit lines which are arranged in row and column directions;
a plurality of read switching elements for selectively controlling connection of the plurality of read bit lines and the plurality of multi-bit serial cells;
a plurality of write switching elements for selectively controlling connection of the plurality of write bit lines and the plurality of multi-bit serial cells;
a plurality of sense amplifiers connected one by one to the plurality of read bit lines;
a read control unit, connected by one by one to the plurality of sense amplifiers, for controlling sensing operations of the plurality of sense amplifiers at a read mode;
a plurality of registers for storing cell data sensed from the plurality of sense amplifiers; and
a write control unit, connected one by one to the plurality of write bit lines, for outputting the cell data stored in the plurality of registers to the plurality of write bit lines at a write mode,
wherein each of the plurality of multi-bit serial cells comprises: a plurality of switching elements whose switching operations are selectively controlled depending on states of a plurality of word lines; and a plurality of ferroelectric capacitors, connected in parallel to the plurality of switching elements, for storing the cell data.

9. The nonvolatile ferroelectric memory device according to claim 8, wherein each of the plurality of multi-bit serial cells, which is connected serially between a write switching element and read switching element, stores the cell data applied from the write bit line sequentially in the plurality of ferroelectric capacitors at the write mode, and outputs the cell data stored in the plurality of ferroelectric capacitors sequentially to the read bit lines at the read mode.

10. The nonvolatile ferroelectric memory device according to claim 9, wherein each of the plurality of multi-bit serial cells outputs the cell data sequentially to the read bit lines while the plurality of word lines are sequentially kept at an enable state when a read enable control signal is activated.

11. The nonvolatile ferroelectric memory device according to claim 10, wherein each of the plurality of multi-bit serial cells stores the cell data applied from the write bit lines sequentially while the plurality of word lines are sequentially kept at a disable state when a write enable control signal is activated.

12. The nonvolatile ferroelectric memory device according to claim 8, wherein the plurality of multi-bit serial cell arranged in the column direction share a pair of one read bit line and one write bit line.

13. The nonvolatile ferroelectric memory device according to claim 12, wherein read/write paths of the plurality of multi-bit serial cells are individually controlled so that read/write operations of other different multi-bit serial cells are simultaneously performed.

14. A nonvolatile ferroelectric memory device comprising:
- a plurality of sub bit lines connected to a read bit line;
- a plurality of serial cells connected serially between the plurality of sub bit lines and a write bit line;
- a global sense amplifier, connected to one by one to the read bit line, for sensing and amplifying cell data applied to the read bit line;
- a plurality of sub sense amplifiers, connected one by one to the plurality of sub bit lines, for sensing cell data applied to the plurality of sub bit lines to output the cell data to the global sense amplifier;
- a register, connected between the global sense amplifier and the write bit line, for storing the cell data applied from the global sense amplifier;
- a plurality of write switching elements for outputting the cell data applied from the write bit line to the serial cell when a write enable control signal is activated; and
- a plurality of read switching elements for outputting the cell data stored in the plurality of serial cells to the plurality of sub bit lines when a read enable control signal is activated,
- wherein each of the plurality of serial cells comprises: a plurality of switching elements whose switching operations are selectively controlled depending on states of a plurality of word lines; and a plurality of ferroelectric capacitors, connected in parallel to the plurality of switching elements, for storing the cell data.

15. The nonvolatile ferroelectric memory device according to claim 14, wherein a plurality of the read bit lines and the write bit lines are arranged in a row direction.

16. The nonvolatile ferroelectric memory device according to claim 14, wherein each of the plurality of serial cells, which is connected serially between a writing switching element and a read switching element, stores the cell data applied from the write bit line sequentially in the plurality of ferroelectric capacitors at a write mode, and outputs the cell data stored in the plurality of ferroelectric capacitors sequentially to a sub bit line at a read mode.

17. The nonvolatile ferroelectric memory device according to claim 16, wherein each of the plurality of serial cells outputs the cell data sequentially to the sub bit line while the plurality of word lines are sequentially kept at an enable state when a read enable control signal is activated.

18. The nonvolatile ferroelectric memory device according to claim 17, wherein each of the plurality of serial cells sequentially stores the cell data applied from the write bit line while the plurality of word lines are sequentially kept at a disable state when a write enable control signal is activated.

19. The nonvolatile ferroelectric memory device according to claim 14, wherein the plurality of serial cells arranged in the column direction share a pair of one read bit line and one write bit line.

20. The nonvolatile ferroelectric memory device according to claim 19, wherein read/write paths of the plurality of serial cells are individually controlled so that read/write operations of other serial cells are simultaneously performed.

* * * * *